(12) United States Patent
Jun et al.

(10) Patent No.: US 6,344,385 B1
(45) Date of Patent: Feb. 5, 2002

(54) DUMMY LAYER DIODE STRUCTURES FOR ESD PROTECTION

(75) Inventors: Cai Jun; Lo Keng Foo, both of Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 09/534,549

(22) Filed: Mar. 27, 2000

(51) Int. Cl.$^7$ ............................................ H01L 21/8234
(52) U.S. Cl. ........................ 438/237; 257/330; 257/333
(58) Field of Search ................................ 257/487, 492, 257/498, 509–510, 360, 515–516, 519, 700, 707, 734, 330, 333; 357/41; 438/259, 270, 271, 589, 237

(56) References Cited

U.S. PATENT DOCUMENTS

| | | | |
|---|---|---|---|
| 5,025,298 A | * 6/1991 | Fay | 357/41 |
| 5,159,518 A | * 10/1992 | Roy | 361/56 |
| 5,608,238 A | * 3/1997 | Matsuda | 257/140 |
| 5,610,790 A | * 3/1997 | Staab | 361/56 |
| 5,623,152 A | * 4/1997 | Majumdar | 257/330 |
| 5,679,972 A | * 10/1997 | Kim | 257/378 |
| 5,708,550 A | 1/1998 | Avery | 361/56 |
| 5,780,905 A | 7/1998 | Chen et al. | 257/355 |
| 5,808,342 A | 9/1998 | Chen et al. | 257/357 |
| 5,850,095 A | 12/1998 | Chen et al. | 257/361 |
| 5,856,214 A | 1/1999 | Yu | 438/133 |
| 6,015,993 A | * 1/2000 | Voldman | 257/355 |

\* cited by examiner

*Primary Examiner*—Olik Chaudhuri
*Assistant Examiner*—Nathan W. Ha
(74) *Attorney, Agent, or Firm*—George O. Saile; Rosemary L. S. Pike

(57) ABSTRACT

Described are structures for a device with a controllable dummy layer which can provide a low controllable trigger voltage and can be used as a first triggered device in ESD protection networks. A controllable dummy layer diode is provided which is structured as a butting diode with a dummy polysilicon layer above the butting region. The dummy polysilicon layer functions as an STI block to remove the STI between the n+ and p+ regions of the diode. In one embodiment the diode has the function of a controllable gate with a punchthrough-like-trigger, in which a capacitor-couple circuit couples a portion of the ESD voltage into the gate of the diode to provide a gate voltage. By changing the channel length under the gate of the diode as well as the gate voltage, the reverse-biased voltage of the diode is readily adjusted to a predetermined level. In a second embodiment the p+ region of the diode overlaps the n+ region turning the diode into a zener diode. The low doping channel region under the dummy polysilicon layer functions as a channel stopper and suppresses the occurrence of the leakage current caused by the zener diode. The adjustment of the channel stopper length and the controllable gate voltage enables the controlling of a zener voltage. When ESD stress is present at the integrated circuit pad the diode, of either type, goes into a controllable voltage level breakdown.

7 Claims, 4 Drawing Sheets

DUMMY LAYER DIODE STRUCTURES FOR ESD PROTECTION

BACKGROUND OF THE INVENTION

1. Field of the Invention

The invention relates to electrostatic discharge (ESD) protection of integrated circuits, and more particularly to reducing the avalanche breakdown voltage of diodes with shallow trench isolation (STI) in deep-quarter-micron processes.

2. Description of the Related Art

The avalanche breakdown voltage of a diode with shallow trench isolation (STI) has been increased to the level where these devices are no longer effective for ESD protection in deep quarter-micron processes. In this situation, the trigger voltage of the diode is higher than the gate oxide breakdown voltage. Thus, the protection window is zero. Diodes with the STI trigger too high fail when first triggered. The problem stems from the uniform electric field of the n+ junction of a diode which is responsible for the high breakdown, as indicated by Arrow F of FIG. 1. FIG. 1 depicts a cross-section of a semiconductor wafer with a p-well 11 having embedded two diodes with a p+ junction 12 each, and having a common n+ cathode 13. Shallow trench isolations 14 separate the p+ and n+ junctions. Therefore, it is essential to invent a new type of diode with a low and controllable trigger voltage.

U.S. Patents relevant to the subject at hand are listed below.

U.S. Pat. No. 5,708,550 (Avery) discloses an ESD protection structure having a dummy supply line.

U.S. Pat. No. 5,856,214 (Yu) shows a low voltage zener-triggered SCR for ESD.

U.S. Pat. No. 5,850,095 (Chen et al.) teaches an ESD protection circuit using a zener diode and an interdigitated NPN transistor.

U.S. Pat. No. 5,808,342 (Chen et al.) shows a bipolar SCR triggering circuit for ESD protection.

U.S. Pat. No. 5,780,905 (Chen et al.) describes an asymmetrical triggering ESD structure.

It should be noted that none of the above-cited examples of the related art utilize a device with a controllable dummy layer which provides a low controllable trigger voltage and which can be used as a first trigger device in ESD protection networks.

SUMMARY OF THE INVENTION

It is an object of the present invention to provide structures and a method for a device with a controllable dummy layer which can provide a low controllable trigger voltage and can be used as a first triggered device in ESD protection networks.

Another object of the present invention is to provide a device for ESD protection in deep-quarter micron processes.

A further object of the present invention is to reduce the avalanche breakdown voltage of the device and to make that breakdown voltage readily adjustable to a predetermined low level.

These objects have been achieved by providing a controllable dummy layer diode which is structured as a butting diode with a dummy polysilicon layer above the butting region. The dummy polysilicon layer functions as an STI block to remove the STI between the n+ and p+ regions of the diode. In one preferred embodiment of the invention the diode has the function of a controllable gate with a punchthrough-like-trigger, in which a capacitor-couple circuit couples a portion of the ESD voltage into the gate of the diode to provide a gate voltage. By changing the channel length under the gate of the diode as well as the gate voltage, the reverse-biased voltage of the diode is readily adjusted to a predetermined level. In a second preferred embodiment of the invention the p+ region of the diode is made to overlap the n+ region turning the diode into a zener diode. The low doping channel region under the dummy polysilicon layer functions as a channel stopper and suppresses the occurrence of the leakage current caused by the zener diode. The adjustment of the channel stopper length and the controllable gate voltage enables the controlling of a zener voltage.

BRIEF DESCRIPTION OF THE DRAWINGS

FIG. 3b is a plan view of a portion of the cross-sectional view of FIG. 3a.

FIG. 5b is a plan view of a portion of the cross-sectional view of FIG. 5a.

DESCRIPTION OF THE PREFERRED EMBODIMENT

Figure 1:
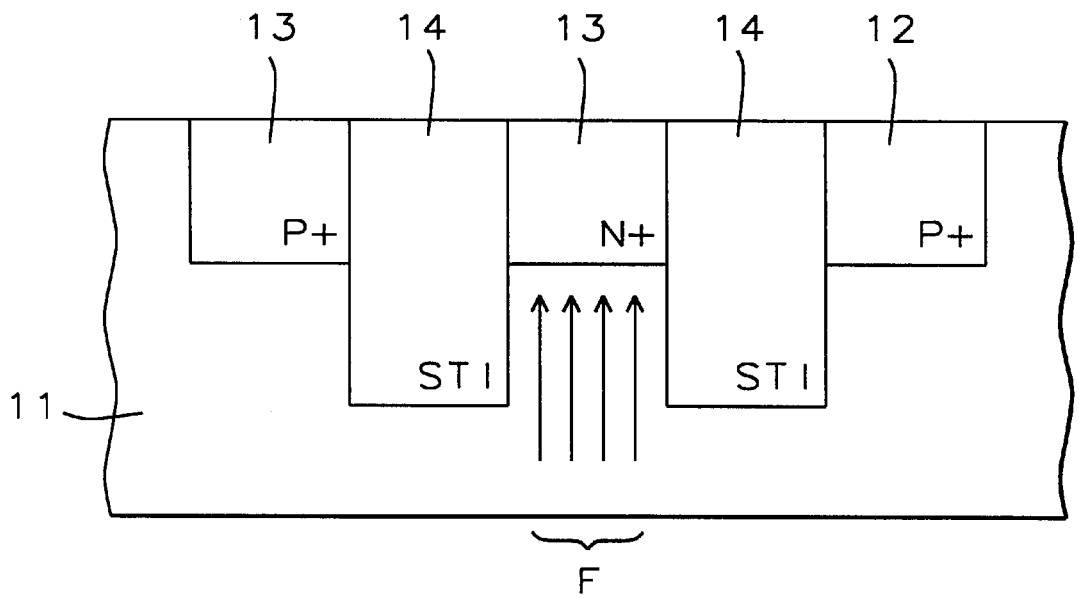
FIG. 1 is a cross-sectional view of two diodes with a common n+ junction and a uniform electric field across that n+ junction.
Figure 2A:
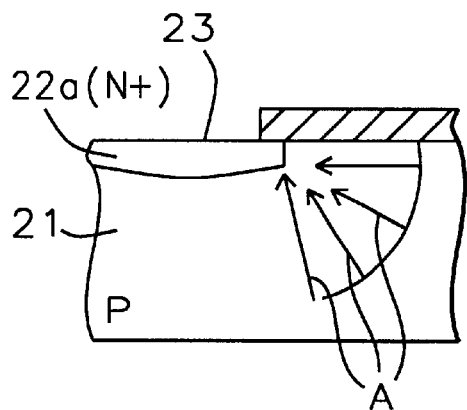
FIGS. 2a and 2b illustrate the electric field crowding for a shallow and for a deep planar diffused junction, respectively.
Figure 2B:
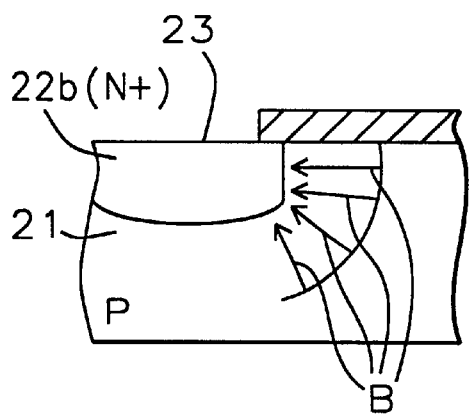

The junction of a diode with a shallow trench isolation (STI) is like some parallel plane junction with a high breakdown voltage. FIG. 2a shows a p-diffusion 21 with an n+ diffusion 22a illustrating a shallow planar diffused junction. Strong electric field crowding is indicated by the closeness of Arrows A at the surface 23 of the semiconductor wafer and results in a low breakdown voltage. In contrast, FIG. 2b shows a p-diffusion 21 with an n+ diffusion 22b illustrating a deep planar diffused junction. This deep planar diffusion approximates a parallel plane junction as illustrated in FIG. 1. The uniform and weaker electric field is indicated by the uniform spacing of Arrows B and results in the aforementioned higher breakdown voltage.

In the present invention two kinds of new devices with a controllable dummy layer provide a low and controllable trigger voltage for reducing the avalanche breakdown voltage of diodes in STI. These two newly invented devices can each be used as a first triggered device in electrostatic discharge (ESD) protection networks for deep-quarter-micron processes.

Key points of the present invention are:

Using a dummy polysilicon layer to remove the STI between n+ and p+ junctions.

Changing the breakdown point from the bottom of the n+/p+ junction to the surface of the semiconductor wafer, as illustrated in FIG. 2b and FIG. 2a, thereby making use of surface electric effects to control the breakdown voltage.

Using the punchthrough and zener concepts, disclosed subsequently, to reduce the diode-like-trigger voltage.

In the first preferred embodiment of the present invention the device is called a dummy layer punchthrough-like-trigger (DPLT) device. The DPLT device is a clamp device between a gate and a source of an inside n-channel transistor (MOS FET) for the protection of the MOS gate. The DPLT is structured as a butting diode with a dummy polysilicon layer above the butting region.

Figure 3A:
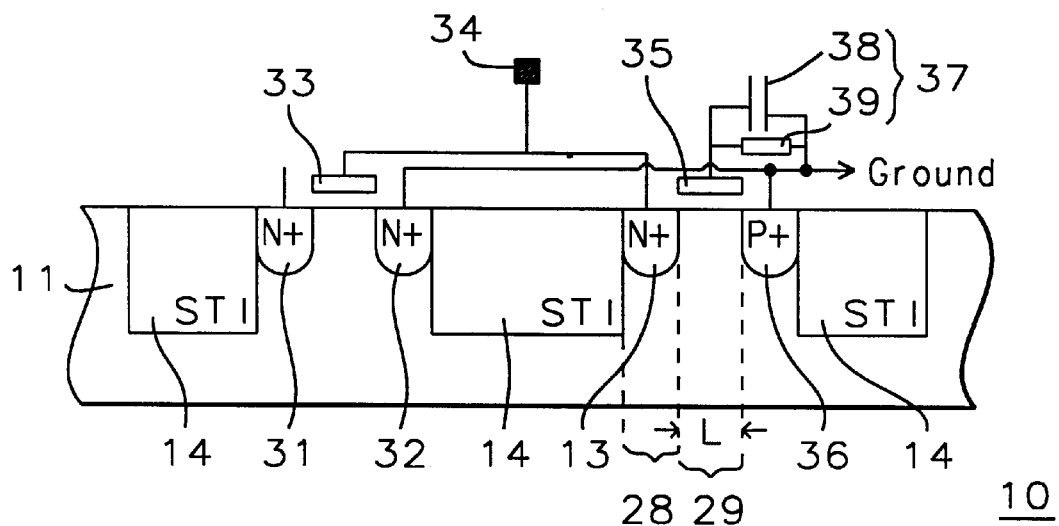
FIG. 3a is a cross-sectional view of the preferred embodiment of the dummy layer punchthrough-like-trigger device (DPLT) of the present invention.
Figure 3B:
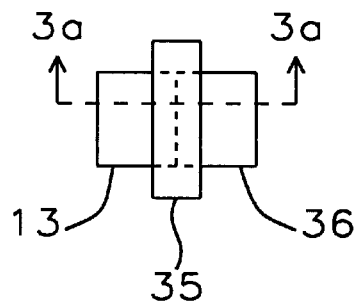

FIG. 3a illustrates the cross-section of a p-well or p-substrate 11 in a semiconductor wafer 10. A diode 28, comprised of p-well or p-substrate 11 as anode and n+ implant 13 as cathode, has a controllable dummy polysilicon layer 35 disposed as a clamp device between gate 33 and source 32 of a MOS type semiconductor device for MOS gate protection. The controllable dummy layer diode is structured as a butting diode with a dummy polysilicon layer 35 above the butting region, i.e. the region where n+ implant 13 and the adjacent p+ implant 36 meet. Also refer to the same items 13, 35, and 36 on the plan view of the diode in FIG. 3b. The dummy polysilicon layer 35 functions as an STI block to remove the STI between the n+ and p+ regions, items 13 and 36 respectively. STI regions 14 separate drain 31 and source 32 from components 13 and 36 and from other structures (not shown). The diode has a controllable gate 35 with a punchthrough-like-trigger, in which a capacitor-couple circuit 37, typically comprised of a capacitor 38 and resistive means 39, couples a portion of an electrostatic discharge (ESD) voltage into gate 35 to provide a gate voltage for the diode in an ESD event. By changing the length L of channel 29 of the diode as well as the gate voltage, the reverse-biased voltage of the diode is readily adjusted to a predetermined level.

Gate 33 and n+ implant 13 are connected to integrated circuit (IC) pad 34 of the chip. Source 32 and p+ implant 36 are typically tied to ground. Capacitor couple circuit 37 is tied at one end to gate 35, as already mentioned, and to ground at the other end. By changing the channel length of the DPLT the punchthrough voltage of the DPLT is changed. Changing the gate voltage of the DPLT changes the depletion region profile under the dummy polysilicon layer. The change of the depletion region profile in turn changes the punchthrough voltage of the DPLT. When the gate voltage exceeds the threshold voltage of the MOS type semiconductor device a zener-like diode appears between the p+/n type inversion layer which is in parallel with the channel depletion region.

Figure 4:
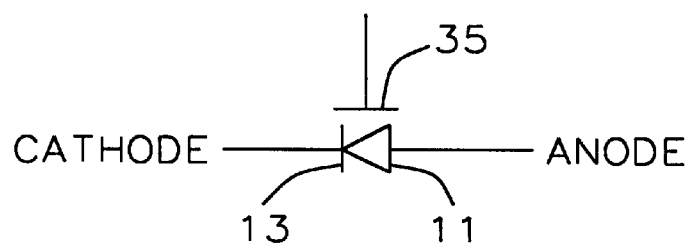
FIG. 4 is a schematic diagram of the DPLT device.

The effect of gate coupling on the surface electric field of the n+/p-well or p-substrate junction is to lower the junction breakdown voltage. FIG. 4 is a schematic diagram of diode 28, showing p-well 11, n+ region 13, and gate 35. The advantage of this first preferred embodiment of the present invention is that all of this makes the reverse-biased voltage of the DPLT readily adjustable to a predetermined low level.

Figure 5A:
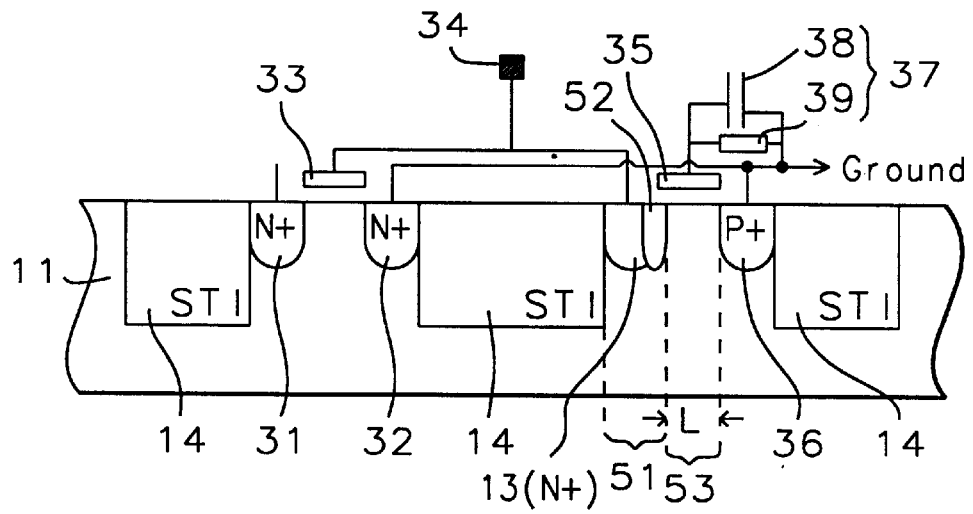
FIG. 5a is a cross-sectional view of the preferred embodiment of the dummy layer zener-like-trigger device (DZLT) of the present invention.
Figure 5B:
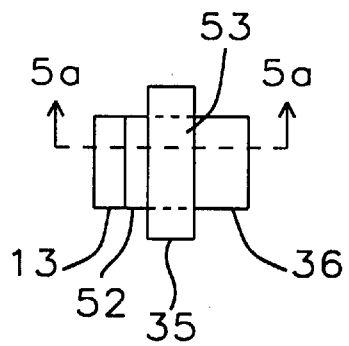

We will now discuss the second preferred embodiment of the present invention by referring to FIG. 5a and FIG. 5b. The device is called a dummy layer zener-like-trigger (DZLT) device. Attention is directed to the fact that most features are the same as those of FIG. 3a and FIG. 3b, where the same numerals designate the same component. When overlapping p+ region 52 of diode 51 is disposed to overlap n+ region 13, the structure is functioning as a zener-type diode. The low doping channel 53 region, of length L, under the dummy polysilicon layer 35 functions as a channel stopper, and suppresses the occurrence of the leakage current caused by the zener type diode. The adjustment of the channel 53 stopper length and the controllable gate voltage enables the controlling of a Zener voltage. When ESD stress is present at the IC pad 34 diode 51 goes into a controllable voltage breakdown. Accordingly, the ESD stress at IC pad 34 is bypassed by the conduction of the diode and the conduction of the whole ESD protection network to thus allow an internal circuit to be protected from ESD damage. FIG. 5b is the top view of diode 51, n+ implant 13, overlapping p+ implant 52, polysilicon gate 35 above channel 53, and p+ implant 36.

The DZLT device is a clamp device between gate 33 and source 32 of an inside MOS FET for the protection of the MOS gate 33. The dummy polysilicon layer 35 functions as a STI block to remove the STI 14 between the n+ 13 cathode/p+ overlapping region 52 and the p+ anode 11 of the DZLT. Analogous to the DPLT device discussed previously, a capacitor-couple circuit 37, typically comprised of a capacitor 38 and resistive means 39, couples a portion of an ESD voltage into gate 35 to provide a gate voltage for the diode in an ESD event. The DZLT has a controllable gate 35 with a zener-like-trigger. The DZLT is structured as a zener diode with a dummy polysilicon layer, gate 35, above the overlapping region of p+ (36) to n+ (13), in which the DZLT can act as a zener-like diode 51 with a gate control channel stopper 53 to suppress leakage currents of diode 51 and to adjust the clamp voltage.

Figure 6:
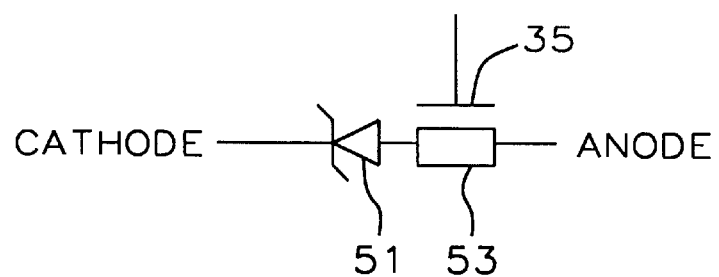
FIG. 6 is a schematic diagram of the DZLT device.

FIG. 6 is a schematic diagram of the DZLT device showing zener-type diode 51 connected to channel 53 and gate 35 disposed above channel 53. Also indicated are the cathode and anode of the DZLT device.

By changing the channel stopper length of the DZLT the channel stopper resistor is changed, which changes the clamp voltage of the DZLT. By changing the gate voltage of the DZLT the channel stopper resistor is changed, which in turn changes the clamp voltage of the DZLT. The advantage of this second preferred embodiment of the present invention is that all of this makes the clamp voltage of the DZLT readily adjustable to a predetermined low level.

Figure 7:
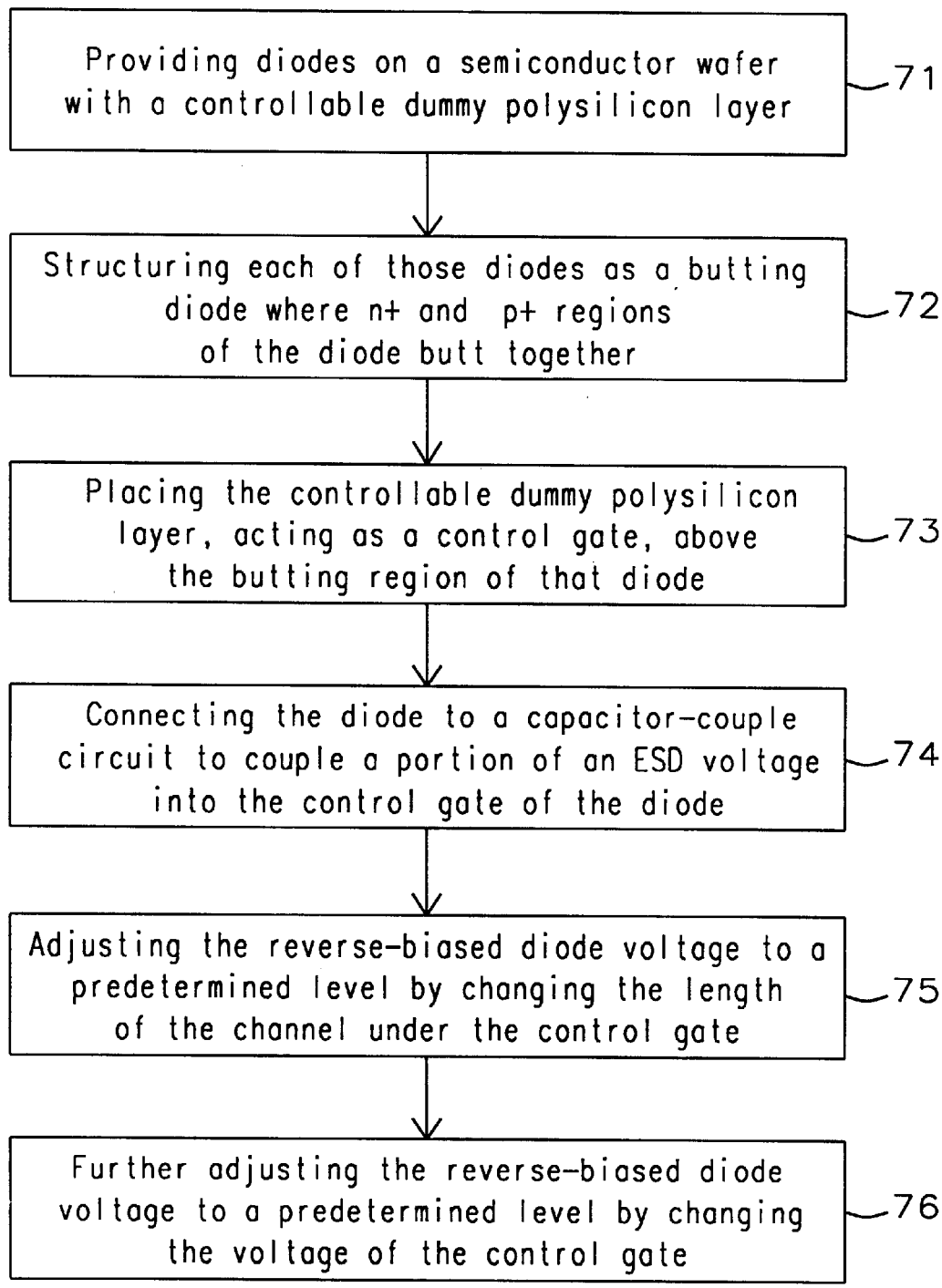
FIG. 7 is a block diagram of the method of the invention.

With reference to block diagram, FIG. 7, we now describe the method of creating a device with a controllable dummy layer structure for electrostatic discharge (ESD) protection, which comprises the following steps:

providing a semiconductor wafer having a p-well, implanting diodes and n-channel transistors in that p-well, providing each of those diodes with a controllable dummy polysilicon layer, where those diodes are disposed as a clamp device between a gate and a source of the n-channel transistor for the protection of the gate from ESD, see BLOCK 71, structuring that diode as a butting diode, where the butting region is defined by the area between the n+ region of the diode and the p-well, see BLOCK 72, placing the controllable dummy polysilicon layer above the butting region of the diode, where the controllable dummy polysilicon layer acts as a control gate for the diode, see BLOCK 73, connecting the diode to a capacitor-couple circuit to couple a portion of an ESD voltage into the control gate of the diode, thus providing a gate voltage for the control gate, see BLOCK 74, adjusting the reverse-biased diode voltage to a predetermined level by changing the length of the aforementioned channel, see BLOCK 75, and further adjusting the reverse-biased diode voltage to a predetermined level by changing the voltage of the control gate, see BLOCK 76.

The method further provides that:

the controllable dummy polysilicon layer functions as a shallow trench isolation (STI) block to remove the STI between the n+ region of the diode and the p-well or p-substrate, the diode functions as a controllable gate with a punchthrough-like-trigger, the diode further functions as a zener type diode when the p+ region of the diode is disposed to overlap the n+ region of the diode, a low doping channel region under the controllable dummy polysilicon layer functions as a channel stopper, the low doping channel region of the zener type diode suppresses the occurrence of leakage currents caused by the zener type diode, adjusting the length of the channel stopper enables the controlling of the zener voltage of the zener type diode, controlling the voltage the control gate enables the controlling of the zener voltage of the zener type diode, when ESD stress is present at the gate of the n-channel transistor, the diode goes into a controllable voltage level breakdown, the ESD stress is bypassed by the conduction of the diode.

While the invention has been particularly shown and described with reference to the preferred embodiments thereof, it will be understood by those skilled in the art that various changes in form and details may be made without departing from the spirit and scope of the invention.

What is claimed is:

1. A method of creating a device with a controllable dummy layer structure for electrostatic discharge (ESD) protection, comprising the steps of:

providing a semiconductor wafer with a p-substrate;

implanting diodes and n-channel transistors in said p-substrate;

providing each of said diodes with a controllable dummy polysilicon layer, said diodes disposed as a clamp device between a gate and a source of said n-channel transistor for the protection of said gate from ESD;

structuring that diode as a butting diodes, said butting region defined by the area between the n+ region of said diodes and said p-substrate;

placing said controllable dummy polysilicon layer above said butting region of said diodes, said controllable dummy polysilicon layer acting as a control gate for said diodes, where the width of said control gate is defined by the channel between said n+ region of said diodes and an adjacent first p+ region;

alternately, creating a gate controlled zener type diode by overlapping a second p+ region with said n+ region of said diodes, such that said channel is bordered by said first and said second p+ region, where said channel is a low doping channel functioning as a channel stopper, said channel suppressing the occurrence of leakage currents caused by said zener diode;

connecting said diodes to a capacitor-couple circuit to couple a portion of an ESD voltage into said control gate of said diodes, thus providing a gate voltage for said control gate;

adjusting the reverse-biased diode voltage to a predetermined level by changing the length of said channel; and further adjusting the reverse-biased diode voltage to a predetermined level by changing the voltage of said control gate.

2. The method of claim 1, wherein said controllable dummy polysilicon layer functions as a shallow trench isolation (STI) block to remove said STI between said n+ region of said diode and said p-substrate.

3. The method of claim 1, wherein said diode functions as a controllable gate with a punchthrough-like-trigger.

4. The method of claim 1, wherein adjusting the length of said channel stopper enables the controlling of the zener voltage of said zener type diode.

5. The method of claim 1, wherein controlling the voltage said control gate enables the controlling of the zener voltage of said zener type diode.

6. The method of claim 1, wherein when ESD stress is present at said gate of said n-channel transistor, said diode goes into a controllable voltage level breakdown.

7. The method of claim 6, wherein said ESD stress is bypassed by the conduction of said diode.

* * * * *